United States Patent [19]
Grill et al.

[11] Patent Number: 6,147,009
[45] Date of Patent: Nov. 14, 2000

[54] HYDROGENATED OXIDIZED SILICON CARBON MATERIAL

[75] Inventors: Alfred Grill, White Plains; Christopher Vincent Jahnes, Monsey; Vishnubhai Vitthalbhai Patel, Yorktown Heights, all of N.Y.; Laurent Claude Perraud, Paris, France

[73] Assignee: International Business Machines Corporation, Armonk, N.Y.

[21] Appl. No.: 09/107,567

[22] Filed: Jun. 29, 1998

[51] Int. Cl.⁷ .................................................. C23C 16/32
[52] U.S. Cl. ........................ 438/780; 438/781; 438/789; 427/577; 427/579; 427/249.15; 427/255.37; 427/255.6
[58] Field of Search ...................... 427/489, 492, 427/497, 503, 509, 515, 577, 578, 579, 249.15, 255.37, 255.6; 438/780, 781, 789

[56] References Cited

U.S. PATENT DOCUMENTS

| | | |
|---|---|---|
| 4,824,690 | 4/1989 | Heinecke et al. . |
| 5,093,153 | 3/1992 | Brochet et al. . |
| 5,494,712 | 2/1996 | Hu et al. .................................. 427/489 |
| 5,554,570 | 9/1996 | Maeda et al. ........................... 438/763 |
| 5,559,637 | 9/1996 | Cohen et al. .............................. 257/77 |
| 5,593,741 | 1/1997 | Ikeda ....................................... 427/579 |
| 5,618,619 | 4/1997 | Petrmichl et al. ....................... 428/334 |
| 5,789,320 | 8/1998 | Andricacos et al. .................... 438/678 |

FOREIGN PATENT DOCUMENTS

| | | |
|---|---|---|
| 19654737 | 7/1997 | Germany . |
| 60-111480 | 6/1985 | Japan . |

OTHER PUBLICATIONS

Luther et al, Planar Copper–Polyimide Back End Of The Line Interconnections For ULSI Devices, Jun. 8–9 1993, VMIC Conference, 1993 ISMIC–102/93/0015, pp. 15–21, especially p. 16.

*Primary Examiner*—Timothy Meeks
*Attorney, Agent, or Firm*—Randy Tung; Robert Trepp

[57] ABSTRACT

A low dielectric constant, thermally stable hydrogenated oxidized silicon carbon film which can be used as an interconnect dielectric in IC chips is disclosed. Also disclosed is a method for fabricating a thermally stable hydrogenated oxidized silicon carbon low dielectric constant film utilizing a plasma enhanced chemical vapor deposition technique. Electronic devices containing insulating layers of thermally stable hydrogenated oxidized silicon carbon low dielectric constant materials that are prepared by the method are further disclosed. To enable the fabrication of thermally stable hydrogenated oxidized silicon carbon low dielectric constant film, specific precursor materials having a ring structure are preferred.

15 Claims, 4 Drawing Sheets ue # 6,147,009

HYDROGENATED OXIDIZED SILICON CARBON MATERIAL

FIELD OF THE INVENTION

The present invention generally relates to a new hydrogenated oxidized silicon carbon (SiCOH) low dielectric constant material which is thermally stable to at least 350° C. and a method for fabricating films of this material and electronic devices containing such films and more particularly, relates to a low dielectric constant, thermally stable hydrogenated oxidized silicon carbon (SiCOH) film for use as an intralevel or interlevel dielectric, cap material, or hard mask/polish stop in a ULSI back-end-of-the-line (BEOL) wiring structure, electronic structures containing the films and a method for fabrication such films and structures.

BACKGROUND OF THE INVENTION

The continuous shrinking in dimensions of electronic devices utilized in ULSI circuits in recent years has resulted in increasing the resistance of the BEOL metalization as well as increasing the capacitance of the intralayer and interlayer. This combined effect increases signal delays in ULSI electronic devices. In order to improve the switching performance of future ULSI circuits, low dielectric constant (k) insulators and particularly those with k significantly lower than that of silicon oxide are needed to reduce the capacitances. Dielectric materials that have low k values have been commercially available, for instance, one of such materials is polytetrafluoroethylene (PTFE) with a k value of 2.0. However, these dielectric materials are not thermally stable when exposed to temperatures above 300~350° C. which renders them useless during integration of these dielectrics in ULSI chips which require a thermal stability of at least 400° C.

The low-k materials that have been considered for applications in ULSI devices include polymers containing Si, C, O, such as methylsiloxane, methylsesquioxanes, and other organic and inorganic polymers. For instance, materials described in a paper "Properties of new low dielectric constant spin-on silicon oxide based dielectrics" by N.Hacker et al., published in Mat. Res. Soc. Symp. Proc., vol. 476 (1997) p25 appear to satisfy the thermal stability requirement, even though some of these materials propagate cracks easily when reaching thicknesses needed for integration in the interconnect structure when films are prepared by a spin-on technique. Furthermore, the precursor materials are high cost and prohibitive for use in mass production. In contrast to this, most of the fabrication steps of VLSI and ULSI chips are carried out by plasma enhanced chemical or physical vapor deposition techniques. The ability to fabricate a low-k material by a PECVD technique using readily available processing equipment will thus simplify its integration in the manufacturing process and create less hazardous waste.

It is therefore an object of the present invention to provide a low dielectric constant material of hydrogenated oxidized silicon carbon which is thermally stable to at least 350° C. and exhibits very low crack propagation.

It is another object of the present invention to provide a method for fabricating a low dielectric constant and thermally stable hydrogenated oxidized silicon carbon film.

It is a further object of the present invention to provide a method for fabricating a low dielectric constant, thermally stable hydrogenated oxidized silicon carbon film from a precursor which contains Si, C, O and H and which may have a ring structure.

It is another further object of the present invention to provide a method for fabricating a low dielectric constant, thermally stable hydrogenated oxidized silicon carbon film from a precursor mixture which contains atoms of Si, C, O, and H.

It is still another further object of the present invention to provide a method for fabricating a low dielectric constant, thermally stable hydrogenated oxidized silicon carbon film in a parallel plate plasma enhanced chemical vapor deposition chamber.

It is yet another object of the present invention to provide a method for fabricating a low dielectric constant, thermally stable hydrogenated oxidized silicon carbon film for use in electronic structures as an intralevel or interlevel dielectric in a BEOL interconnect structure.

It is still another further object of the present invention to provide a method for fabricating a thermally stable hydrogenated oxidized silicon carbon film of low dielectric constant capable of surviving a process temperature of at least 350° C. for four hours.

It is yet another further object of the present invention to provide a low dielectric constant, thermally stable hydrogenated oxidized silicon carbon film that has low internal stresses and a dielectric constant of not higher than 3.6.

It is still another further object of the present invention to provide an electronic structure incorporating layers of insulating materials as intralevel or interlevel dielectrics in a BEOL wiring structure in which at least one of the layers of insulating materials comprise hydrogenated oxidized silicon carbon films.

It is yet another further object of the present invention to provide an electronic structure which has layers of hydrogenated oxidized silicon carbon films as intralevel or interlevel dielectrics in a BEOL wiring structure which contains at least one dielectric cap layer formed of different materials for use as a reactive ion etching mask, a polish stop or a diffusion barrier.

It is still another further object of the present invention to provide an electronic structure with intralevel or interlevel dielectrics in a BEOL wiring structure which has at least one layer of hydrogenated oxidized silicon carbon films as reactive ion etching mask, a polish stop or a diffusion barrier.

SUMMARY OF THE INVENTION

In accordance with the present invention, a novel hydrogenated oxidized silicon carbon (SiCOH) low dielectric constant material that is thermally stable to at least 350° C. is provided. The present invention further provides a method for fabricating a thermally stable, low dielectric constant hydrogenated oxidized silicon carbon film by reacting a precursor gas containing atoms of Si, C, O, and H in a parallel plate plasma enhanced chemical vapor deposition chamber. The present invention still further provides an electronic structure that has layers of insulating materials as intralevel or interlevel dielectrics used in a BEOL wiring structure wherein the insulating material can be a hydrogenated oxidized silicon carbon film.

In a preferred embodiment, a method for fabricating a thermally stable hydrogenated oxidized silicon carbon film can be carried out by the operating steps of first providing a parallel plate plasma enhanced chemical vapor deposition chamber, positioning an electronic structure in the chamber, flowing a precursor gas containing atoms of Si, C, O, and H into the chamber, depositing a hydrogenated oxidized silicon carbon film on the substrate, and optionally heat treating the film at a temperature not less than 300° C. for a time period of at least 0.5 hour. The method may further include the step of providing a parallel plate reactor which has a conductive area of a substrate chuck between about 300 cm2 and about 700 cm², and a gap between the substrate and a top electrode between about 1 cm and about 10 cm. A RF power is applied to one of the electrodes at a frequency between about 12 MHZ and about 15 MHZ. The substrate may be positioned on the powered electrode or on the grounded electrode. An optional heat treating step may further be conducted at a temperature not higher than 300° C. for a first time period and then at a temperature not lower than 380° C. for a second time period, the second time period is longer than the first time period. The second time period may be at least 10 folds of the first time period.

The precursor utilized can be selected from molecules with ring structures such as 1,3,5,7-tetramethylcyclotetrasiloxane (TMCTS, or $C_4H_{16}O_4Si_4$), tetraethylcyclotetrasiloxane ($C_8H_{24}O_4Si_4$), or decamethylcyclopentasiloxane ($C_{10}H_{30}O_5Si_5$). However, other precursors comprising Si, C, O, and H containing gases may also be used. Such precursors may be selected from the group of methylsilanes, such as tetramethylsilane ($Si(CH_3)_4$) or trimethylsilane ($SiH(CH_3)_3$)), with or without the addition of oxygen to the feed gas. The precursor can be delivered directly as a gas to the reactor delivered as a liquid vaporized directly within the reactor, or transported by an inert carrier gas such as helium or argon. The precursor mixture may further contain elements such as nitrogen, fluorine or germanium.

The deposition step for the hydrogenated oxidized silicon carbon low dielectric constant film may further include the steps of setting the substrate temperature at between about 25° C. and about 400° C., setting the RF power density at between about 0.02 W/cm² and about 1.0 W/cm², setting the precursor flow rate at between about 5 sccm and about 200 sccm, setting the to chamber pressure at between about 50 mTorr and about 3 Torr, and setting a substrate DC bias at between about 0 VDC and about –400 VDC. The deposition process can be conducted in a parallel plate type plasma enhanced chemical vapor deposition chamber.

The present invention is further directed to an electronic structure which has layers of insulating materials as intra-level or interlevel dielectrics in a BEOL interconnect structure which includes a pre-processed semiconducting substrate that has a first region of metal embedded in a first layer of insulating material, a first region of conductor embedded in a second layer of insulating material which comprises SiCOH, said second layer of insulating material being in intimate contact with said first layer of insulating material, said first region of conductor being in electrical communication with said first region of metal, and a second region of conductor being in electrical communication with said first region of conductor and being embedded in a third layer of insulating material comprises SiCOH, said third layer of insulating material being in intimate contact with said second layer of insulating material. The electronic structure may further include a dielectric cap layer situated in-between the first layer of insulating material and the second layer of insulating material, and may further include a dielectric cap layer situated in-between the second layer of insulating material and the third layer of insulating material. The electronic structure may further include a first dielectric cap layer between the second layer of insulating material and the third layer of insulating material, and a second dielectric cap layer on top of the third layer of insulating material.

The dielectric cap material can be selected from silicon oxide, silicon nitride, silicon oxinitride, refractory metal silicon nitride with the refractory metal being Ta, Zr, Hf or W, silicon carbide, silicon carbo-oxide, and their hydrogenated compounds. The first and the second dielectric cap layer may be selected from the same group of dielectric materials. The first layer of insulating material may be silicon oxide or silicon nitride or doped varieties of these materials, such as PSG or BPSG. The electronic structure may further include a diffusion barrier layer of a dielectric material deposited on at least one of the second and third layer of insulating material. The electronic structure may further include a dielectric layer on top of the second layer of insulating material for use as a RIE hard mask/polish stop layer and a dielectric diffusion barrier layer on top of the dielectric RIE hard mask/polish-stop layer. The electronic structure may further include a first dielectric RIE hard mask/polish-stop layer on top of the second layer of insulating material, a first dielectric RIE diffusion barrier layer on top of the first dielectric polish-stop layer, a second dielectric RIE hard mask/polish-stop layer on top of the third layer of insulating material, and a second dielectric diffusion barrier layer on top of the second dielectric polish-stop layer. The electronic structure may further include a dielectric cap layer of same materials as mentioned above between an interlevel dielectric of SiCOH and an intralevel dielectric of SiCOH.

BRIEF DESCRIPTION OF THE DRAWINGS

These and other objects, features and advantages of the present invention will become apparent from the following detailed description and the appended drawings in which.

DETAILED DESCRIPTION OF THE PREFERRED AND ALTERNATE EMBODIMENTS

The present invention discloses a novel hydrogenated oxidized silicon carbon material (SiCOH) comprising Si, C, O and H in a covalently bonded network which is thermally stable to at least 350° C. and having a dielectric constant of not more than 3.6. The present invention further discloses a method for fabricating SiCOH films in a parallel plate plasma enhanced chemical vapor deposition chamber. A precursor gas containing Si, O, C and H and optionally containing molecules which have a ring structure can be used for forming the SiCOH film. The SiCOH low dielectric constant film can further be heat treated at a temperature not less than 300° C. for at least 0.5 hour to improve its thermal stability.

The present invention therefore discloses a method for preparing thermally stable SiCOH films that have low dielectric constant, e.g., lower than 3.6, which are suitable for integration in a BEOL wiring structure. The films can be prepared by choosing a suitable precursor and a specific combination of processing parameters as described below.

Figure 1:
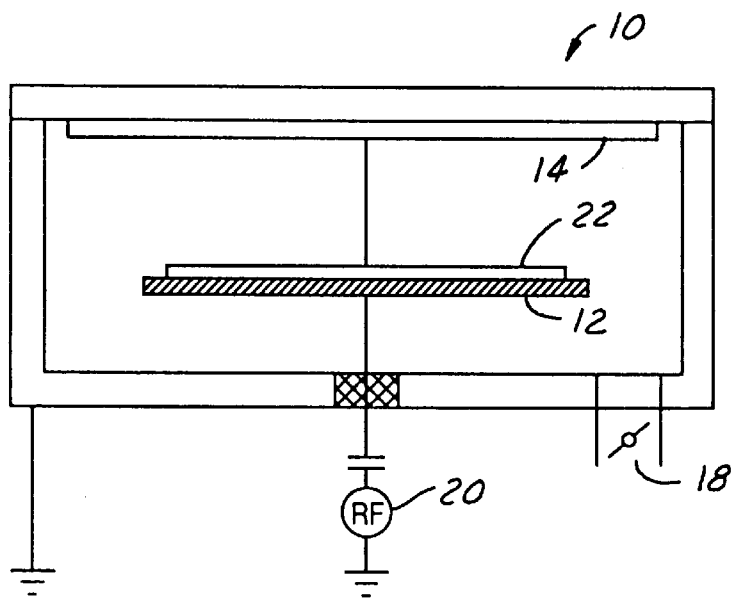
FIG. 1 is a cross-sectional view of the present invention parallel plate chemical vapor deposition chamber.

Referring initially to FIG. 1 wherein a simplified view of a PECVD reactor 10 for processing 200 mm wafers is shown. The gas precursors are introduced into reactor 10 through the gas distribution plate (GDP) 14, which is separated from the substrate chuck 12 by a gap and are pumped out through a pumping port 18. The RF power 20 is connected to the substrate chuck 12 and transmitted to the substrate 22. For practical purposes, all other parts of the reactor are grounded. The substrate 22 thus acquires a negative bias, whose value is dependent on the reactor geometry and plasma parameters. In a different embodiment, the RF power 20 can be connected to the GDP 14, which is electrically insulated from the chamber, and the substrate chuck 12 is grounded. In another embodiment, more than one electrical power supply can be used. For instance, two power supplies can operate at the same RF frequency, or one may operate at a low frequency and one at a high. frequency. The two power supplies may be connected both to same electrode or to separate electrodes. In another embodiment the RF power supply can be pulsed on and off during deposition. Process variables controlled during deposition of the low-k films are RF power, precursor mixture and flow rate, pressure in reactor, and substrate temperature. Following are several examples of deposition of low-k films from a precursor of TMCTS. In these examples, the precursor vapors were transported into the reactor by using He as a carrier gas. After deposition, the films were heat treated at 400° C. to stabilize their properties.

EXAMPLE 1

In this implementation example, a plasma was operated in a continuous mode during film deposition. The pressure in the reactor was maintained at 300 mTorr. The substrate was positioned on the powered electrode to which a RF power of 25 W was applied at a frequency of 13.56 MHZ. The substrate acquired a self negative bias of −75 VDC. The film thus deposited had a dielectric constant of k=4.0 in as-deposited condition. After stabilization anneal, the film has a dielectric constant of k=3.55.

EXAMPLE 2

In this implementation example, the plasma was operated in a continuous mode during film deposition. The pressure in the reactor was maintained at 400 mTorr. The substrate was positioned on the powered electrode to which a RF power of 7 W was applied at a frequency of 13.56 MHZ. The substrate acquired a self negative bias of −25 VDC. The film deposited has a dielectric constant of k=3.33 in as-deposited condition. After stabilization anneal, the film has a dielectric constant of k=2.95.

EXAMPLE 3

In this implementation example, the plasma was operated in a pulsed mode during film deposition, i.e., with a plasma-on time of 18 ms and a plasma-off time of 182 ms per cycle. The pressure in the reactor was maintained at 300 mTorr. The substrate was positioned on the powered electrode to which a RF power of 9 W was applied at a frequency of 13.56 MHZ. The substrate acquired a self negative bias of −9 to 0 VDC. The film thus deposited has a dielectric constant of k=3.4 in as-deposited condition. After stabilization anneal, the film has a dielectric constant of k=2.96.

EXAMPLE 4

In this implementation example, a different precursor of tetramethylsilane was used with the plasma operated in continuous mode during film deposition. The pressure in the reactor was maintained at 200 mTorr. The substrate was positioned on the powered electrode to which a RF power of 9 W was applied at a frequency of 13.56 MHZ. The substrate acquired a self negative bias of −200 VDC. The film thus deposited has a dielectric constant of k=3.6 in as-deposited condition. After stabilization anneal, the film has a dielectric constant of k=2.86.

The present invention novel material composition includes atoms of Si, C, O and H. A suitable concentration range can be advantageously selected from between about 5 and about 40 atomic percent of Si; between about 5 and about 45 atomic percent of C; between about 0 and about 50 atomic percent of O; and between about 10 and about 55 atomic percent of H. It should be noted that when the atomic percent of O is 0, a composition of SiCH is produced which has properties similar to that of SiCOH and therefore, may also be suitably used as a present invention composition. For instance, Example 4 describes a film of SiCH with no oxygen. The SiCH film may be deposited by flowing a precursor gas containing Si, C and H into a plasma enhanced chemical vapor deposition chamber. The present invention material composition may further include at least one element such as F, N or Ge while producing similarly desirable results of the present invention.

Figure 2:
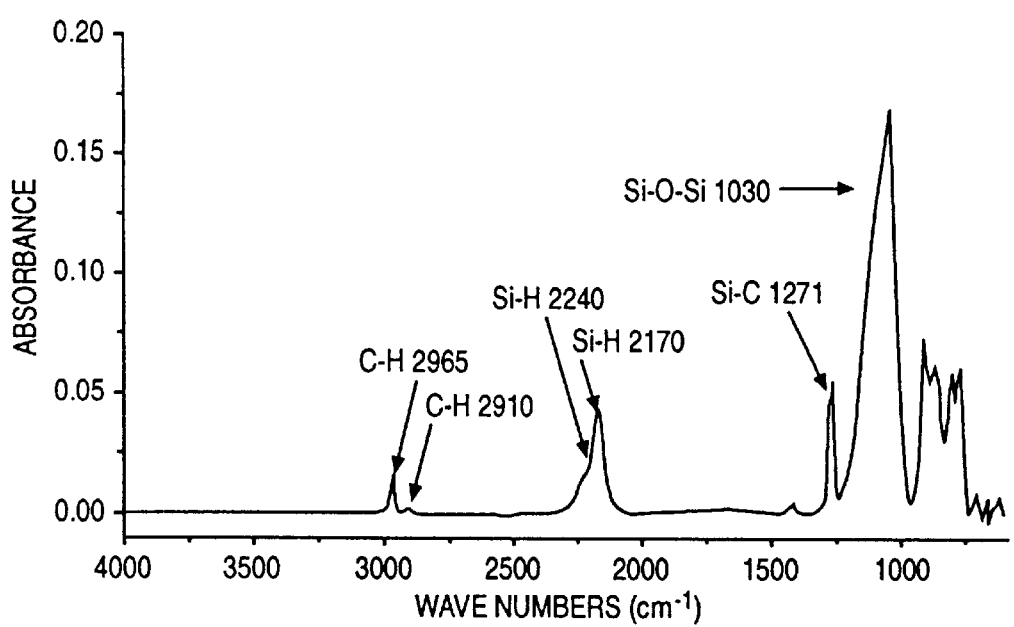
FIG. 2 is a graph illustrating a FTIR spectrum obtained on a SiCOH film prepared by the present invention method.
Figure 3:
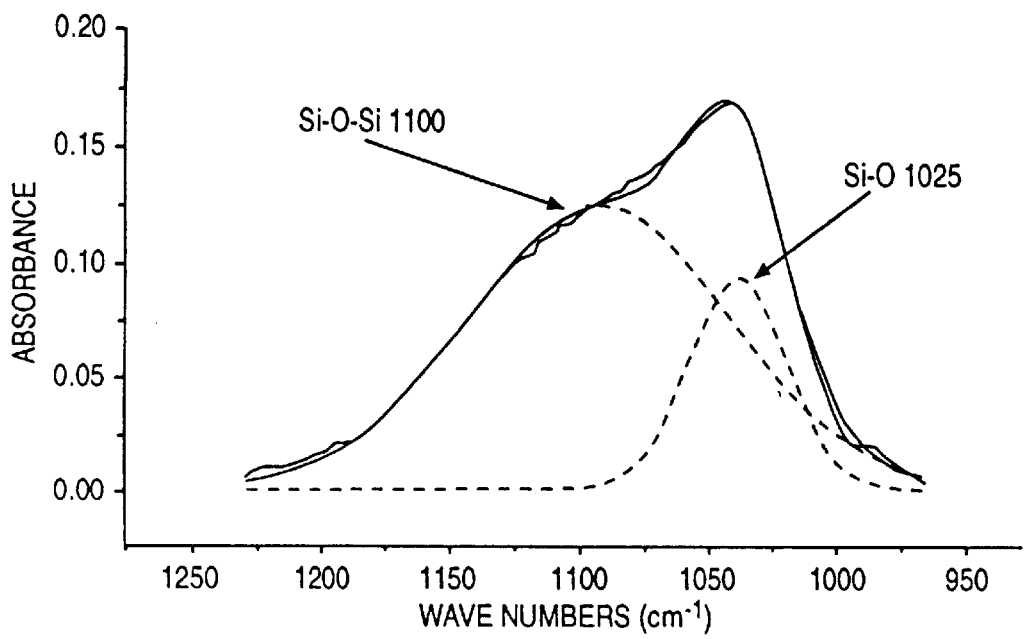
FIG. 3 is a graph illustrating a FTIR spectrum of a SiCOH film of the present invention showing a deconvolution of a Si—O—Si peak into Si—O—Si and Si—O peaks.

The films deposited as described above are characterized by FTIR spectrum similar to the one shown in FIG. 2. The spectrum has absorption peaks corresponding to C—H bonds at 2965 cm$^{-1}$ and 2910 cm$^{-1}$, Si—H bonds at 2240 cm$^{-1}$ and 2170 cm$^{-1}$, Si—C bonds at 1271 cm$^{-1}$ and Si—O—Si bonds at 1030 cm$^{-1}$. The relative intensities of these peaks can change with changing deposition conditions. The peak at 1030 cm$^{-1}$ can be deconvoluted in two peaks at 1100 cm$^{-1}$ and 1025 cm$^{-1}$ as illustrated in FIG. 3. The latter peak is at the same position as in the TMCTS precursor, indicating some preservation of the precursor ring structure in the deposited film. The ratio of the area of the 100 cm$^{-1}$ peak to that of the 1025 cm$^{-1}$ peak increases from 0.2 to more than 1.1 with decreasing value of the dielectric constant from 4 to 2.95.

Figure 4:
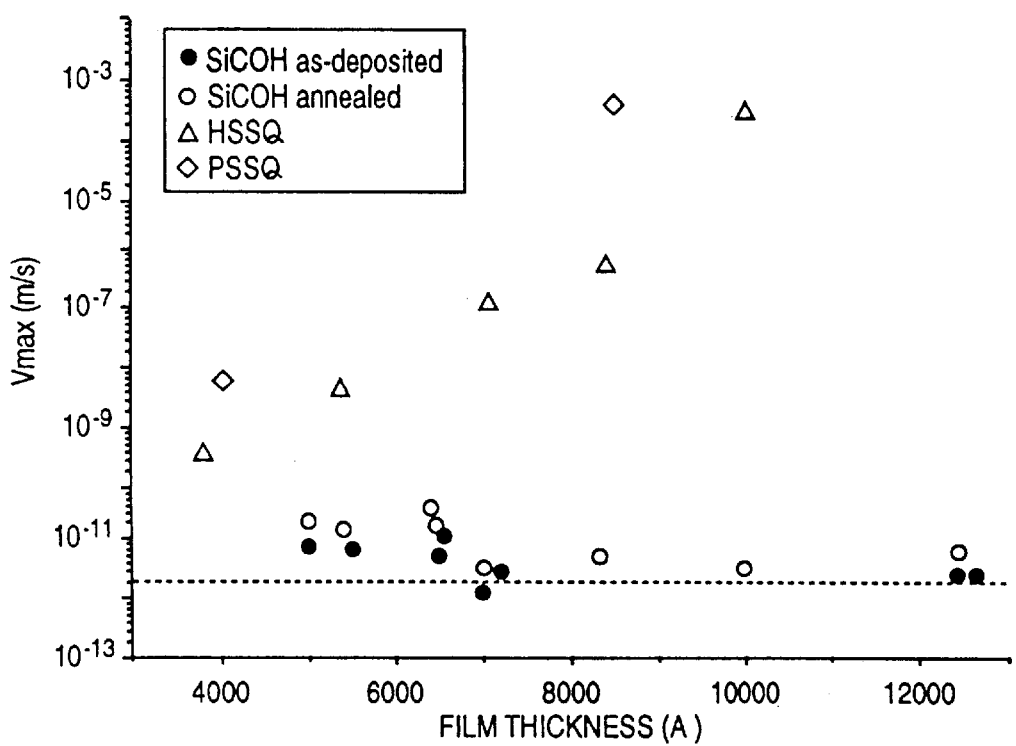
FIG. 4 is a graph illustrating the dependence of crack growth velocity data obtained in water on film thicknesses for the present invention SiCOH films and typical Si based spin-on dielectric films.
Figure 5:
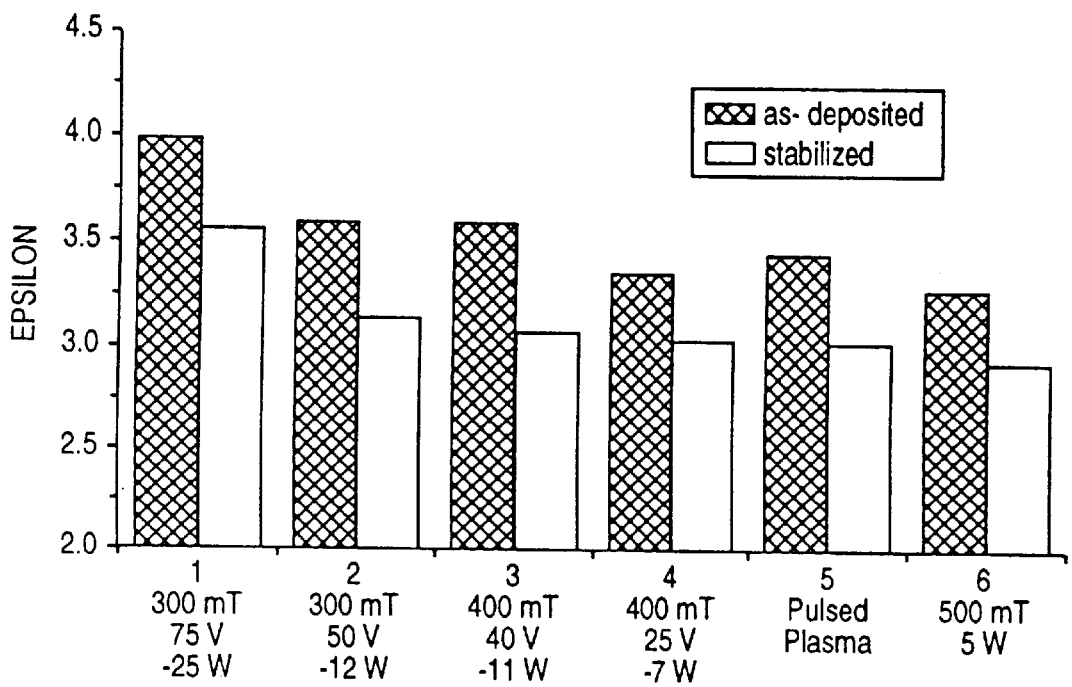
FIG. 5 is a graph illustrating the dielectric constants of the present invention SiCOH films prepared under various PECVD processing conditions.

FIG. 4 presents a comparison of the crack growth velocity in water of the present SiCOH films with those of low-dielectric constant polymeric films containing similar elements. The dotted line indicates the resolution limit of the measuring tool. FIG. 5 presents the dielectric constants of present SiCOH films prepared in different plasma conditions.

Other gases such as Ar, $H_2$, and $N_2$ can be used as carrier gases. If the precursor has sufficient vapor pressure no carrier gas may be needed. An alternative way to transport a liquid precursor to the plasma reactor is by use of a liquid delivery system. Nitrogen, hydrogen, germanium, or fluorine containing gases can be added to the gas mixture in the reactor if needed to modify the low-k film properties. The SiCOH films may thus contain atoms such as Ge, N and F.

If required the deposited SiCOH films may further be stabilized before undergoing further integration processing to either evaporate the residual volatile contents and to dimensionally stabilize the films or just dimensionally stabilize the films. The stabilization process can be carried out in a furnace annealing step at between 300° C. and 400° C. for a time period between about 0.5 and about 4 hours. The stabilization process can also be performed in a rapid thermal annealing process at temperatures above 300° C. The dielectric constant of the SiCOH films obtained according to the present invention novel process are not higher than 3.6. The thermal stability of the SiCOH films obtained according to the present invention process is up to at least a temperature of 350° C.

The SiCOH films obtained by the present invention process are characterized by dielectric constants of k<3.6, and are thermally stable for process integration in a BEOL interconnect structure which is normally processed at temperatures of up to 400° C. Furthermore, these SiCOH films have extremely low crack propagation velocities in water, i.e., below $10^{-9}$ m/s and may even be below $10^{-11}$ m/s. In contrast, polymeric dielectric films are characterized by crack propagation velocities in water of $10^{-6}$ m/s to $10^{-3}$ m/s at similar thicknesses between 700 nm and 1300 nm. The present invention novel material and process can therefore be easily adapted in producing SiCOH films as intralevel and interlevel dielectrics in BEOL processes for logic and memory devices.

The electronic devices formed by the present invention novel method are shown in FIGS. 6–9. It should be noted that the devices shown in FIGS. 6–9 are merely illustration examples of the present invention method while an infinite number of other devices may also be formed by the present invention novel method.

Figure 6:
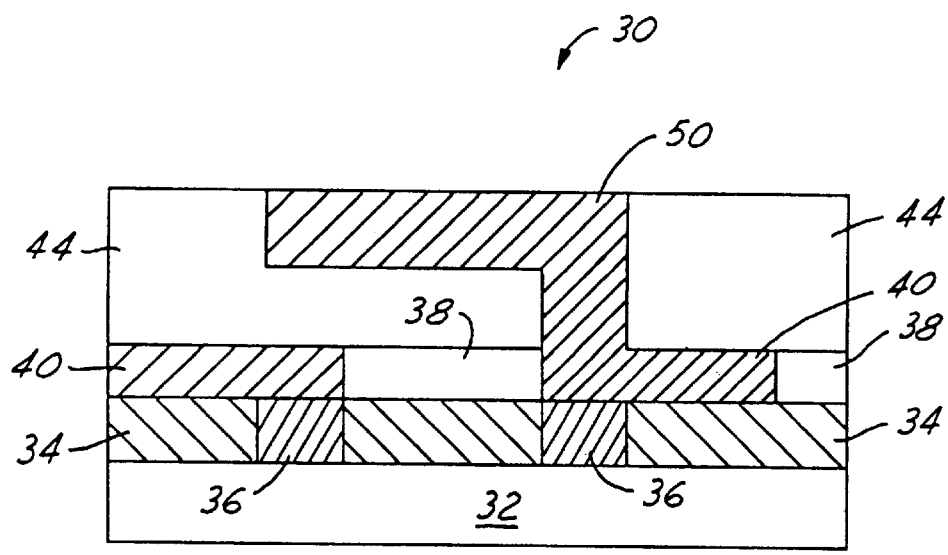
FIG. 6 is an enlarged cross-sectional view of a present invention electronic device having an intralevel dielectric layer and an interlevel dielectric layer of SiCOH.

In FIG. 6, an electronic device 30 is shown which is built on a silicon substrate 32. On top of the silicon substrate 32, an insulating material layer 34 is first formed with a first region of metal 36 embedded therein. After a CMP process is conducted on the first region of metal 36, a hydrogenated oxidized silicon carbon film such as a SiCOH film 38 is deposited on top of the first layer of insulating material 34 and the first region of metal 36. The first layer of insulating material 34 may be suitably formed of silicon oxide, silicon nitride, doped varieties of these materials, or any other suitable insulating materials. The SiCOH film 38 is then patterned in a photolithography process and a conductor layer 40 is deposited therein. After a CMP process on the first conductor layer 40 is carried out, a second layer of SiCOH film 44 is deposited by a plasma enhanced chemical vapor deposition process overlying the first SiCOH film 38 and the first conductor layer 40. The conductor layer 40 may be deposited of a metallic material or a nonmetallic conductive material. For instance, a metallic material of aluminum or copper, or a nonmetallic material of nitride or polysilicon. The first conductor 40 is in electrical communication with the first region of metal 36.

A second region of conductor 50 is then formed after a photolithographic process on second SiCOH film layer 44 is conducted followed by a deposition process for the second conductor material. The second region of conductor 50 may also be deposited of either a metallic material or a nonmetallic material, similar to that used in depositing the first conductor layer 40. The second region of conductor 50 is in electrical communication with the first region of conductor 40 and is embedded in the second layer of SiCOH insulator 44. The second layer of SiCOH film is in intimate contact with the first layer of insulating material 38. In this specific example, the first layer of insulating material 38 of SiCOH is an intralevel dielectric material, while the second layer of insulating material, i.e., the SiCOH film 44 is both an intralevel and an interlevel dielectric. Based on the low dielectric constant of the SiCOH film, superior insulating property can be achieved by the first insulating layer 38 and the second insulating layer 44.

Figure 7:
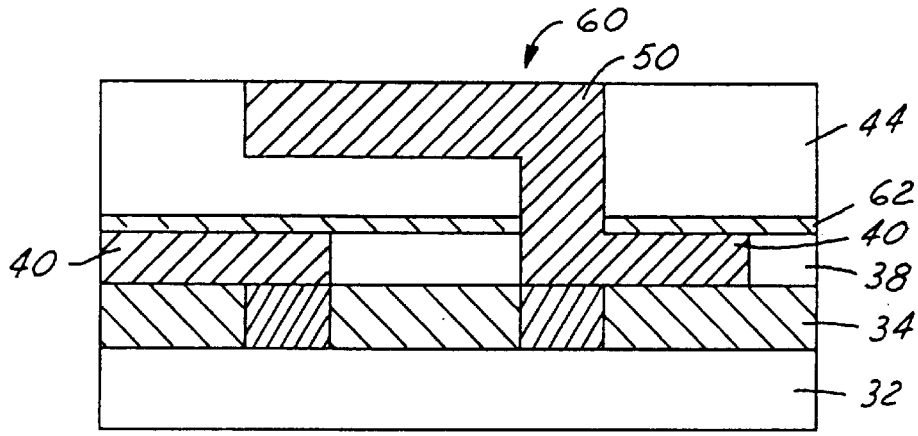
FIG. 7 is an enlarged, cross-sectional view of the present invention electronic structure of FIG. 6 having an additional diffusion barrier dielectric cap layer on top of the SiCOH film.

FIG. 7 shows a present invention electronic device 60 similar to that of electronic device 30 shown in FIG. 6, but with an additional dielectric cap layer 62 deposited between the first insulating material layer 38 and the second insulating material layer 44. The dielectric cap layer 62 can be suitably formed of a material such as silicon oxide, silicon nitride, silicon oxinitride, refractory metal silicon nitride with the refractory metal being Ta, Zr, Hf or W, silicon carbide, silicon carbo-oxide (SiCO), and their hydrogenated compounds. The additional dielectric cap layer 62 functions as a diffusion barrier layer for preventing diffusion of the first conductor layer 40 into the second insulating material layer 44 or into the lower layers, especially into layers 34 and 32.

Figure 8:
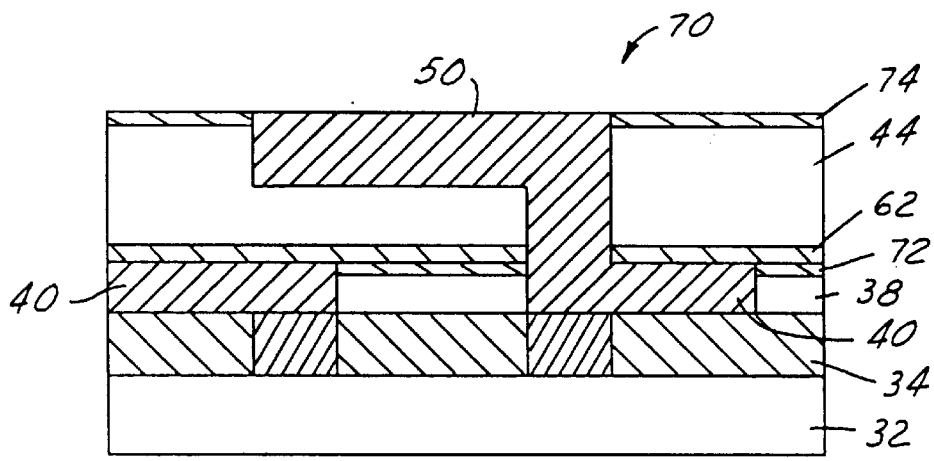
FIG. 8 is an enlarged, cross-sectional view of the present invention electronic structure of FIG. 7 having an additional RIE hard mask/polish stop dielectric cap layer and a dielectric cap diffusion barrier layer on top of the polish-stop layer.

Another alternate embodiment of the present invention electronic device 70 is shown in FIG. 8. In the electronic device 70, two additional dielectric cap layers 72 and 74 which act as a RIE mask and CMP (chemical mechanical polishing) polish stop layer are used. The first dielectric cap layer 72 is deposited on top of the first insulating material (SiCOH) layer 38 and used as a RIE mask. The function of the second dielectric layer 74 is to provide an end point for the CMP process utilized in planarizing the first conductor layer 40. The polish stop layer 74 can be deposited of a suitable dielectric material such as silicon oxide, silicon nitride, silicon oxinitride, refractory metal silicon nitride with the refractory metal being Ta, Zr, Hf or W, silicon carbide, silicon carbo-oxide (SiCO), and their hydrogenated compounds. The top surface of the dielectric layer 72 is at the same level as the first conductor layer 40. A second dielectric layer 74 can be added on top of the second insulating material (SiCOH) layer 44 for the same purposes.

Figure 9:
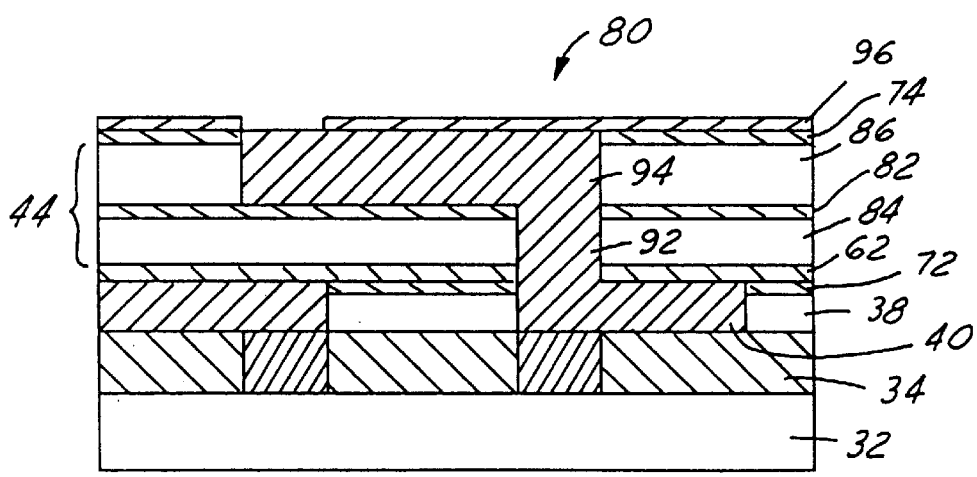
FIG. 9 is an enlarged, cross-sectional view of the present invention electronic structure of FIG. 8 having additional RIE hard mask/polish stop dielectric layers on top of the interlevel SiCOH film.

Still another alternate embodiment of the present invention electronic device 80 is shown in FIG. 9. In this alternate embodiment, an additional layer of dielectric 82 is deposited and thus dividing the second insulating material layer 44 into two separate layers 84 and 86. The intralevel and interlevel dielectric layer 44 formed of SiCOH, shown in FIG. 8, is therefore divided into an interlayer dielectric layer 84 and an intralevel dielectric layer 86 at the boundary between via 92 and interconnect 94. An additional diffusion barrier layer 96 is further deposited on top of the upper dielectric layer 74. The additional benefits provided by this alternate embodiment electronic structure 80 is that dielectric layer 82 acts as an RIE etch stop providing superior interconnect depth control.

Still other alternate embodiments may include an electronic structure which has layers of insulating material as intralevel or interlevel dielectrics in a wiring structure that includes a pre-processed semiconducting substrate which has a first region of metal embedded in a first layer of insulating material, a first region of conductor embedded in a second layer of said insulating material wherein the second layer of insulating material is in intimate contact with the first layer of insulating material, and the first region of conductor is in electrical communication with the first region of metal, a second region of conductor in electrical communication with the first region of conductor and is embedded in a third layer of insulating material, wherein the third layer of insulating material is in intimate contact with the second layer of insulating material, a first dielectric cap layer between the second layer of insulating material and the third layer of insulating material, and a second dielectric cap layer on top of the third layer of insulating material, wherein the first and the second dielectric cap layers are formed of a material that includes atoms of Si, C, O and H, or preferably a chemical composition of SiCOH.

Still other alternate embodiments of the present invention include an electronic structure which has layers of insulating material as intralevel or interlevel dielectrics in a wiring structure that includes a pre-processed semiconducting substrate that has a first region of metal embedded in a first layer of insulating material, a first region of conductor embedded in a second layer of insulating material which is in intimate contact with the first layer of insulating material, the first region of conductor is in electrical communication with the first region of metal, a second region of conductor that is in electrical communication with the first region of conductor and is embedded in a third layer of insulating material, the third layer of insulating material is in intimate contact with. the second layer of insulating material, and a diffusion barrier layer formed of a material including atoms of Si, C, O and H deposited on at least one of the second and third layers of insulating material.

Still other alternate embodiments include an electronic structure which has layers of insulating material as intralevel or interlevel dielectrics in a wiring structure that includes a pre-processed semiconducting substrate that has a first region of metal embedded in a first layer of insulating material, a first region of conductor embedded in a second layer of insulating material which is intimate contact with the first layer of insulating material, the first region of conductor is in electrical communication with the first region of metal, a second region of conductor in electrical communication with the first region of conductor and is embedded in a third layer of insulating material, the third layer of insulating material is in intimate contact with the second layer of insulating material, a reactive ion etching (RIE) hard mask/polish stop layer on top of the second layer of insulating material, and a diffusion barrier layer on top of the RIE hard mask/polish stop layer, wherein the RIE hard mask/polish stop layer and the diffusion barrier layer are formed of a material including atoms of Si, C, O and H.

Still other alternate embodiments include an electronic structure which has layers of insulating materials as intralevel or interlevel dielectrics in a wiring structure that includes a pre-processed semiconducting substrate that has a first region of metal embedded in a first layer of insulating material, a first region of conductor embedded in a second layer of insulating material which is in intimate contact with the first layer of insulating material, the first region of conductor is in electrical communication with the first region of metal, a second region of conductor in electrical communication with the first region of conductor and is embedded in a third layer of insulating material, the third layer of insulating material is in intimate contact with the second layer of insulating material, a first RIE hard mask, polish stop layer on top of the second layer of insulating material, a first diffusion barrier layer on top of the first RIE hard mask/polish stop layer, a second RIE hard mask/polish stop layer on top of the third layer of insulating material, and a second diffusion barrier layer on top of the second RIE hard mask/polish stop layer, wherein the RIE hard mask/polish stop layers and the diffusion barrier layers are formed of a material including atoms of Si, C, O and H.

Still other alternate embodiments of the present invention includes an electronic structure that has layers of insulating material as intralevel or interlevel dielectrics in a wiring structure similar to that described immediately above but further includes a dielectric cap layer which is formed of a material including atoms of Si, C, O and H situated between an interlevel dielectric layer and an intralevel dielectric layer.

The present invention novel method and the electronic structures formed by such method have therefore been amply demonstrated in the above descriptions and in the appended drawings of FIGS. 1~9. It should be emphasized that the examples of the present invention electronic structures shown in FIGS. 6~9 are merely used as illustrations for the present invention. novel method which, obviously, can be applied in the fabrication of an infinite number of electronic devices.

While the present invention has been described in an illustrative manner, it should be understood that the terminology used is intended to be in a nature of words of description rather than of limitation.

Furthermore, while the present invention has been described in terms of a preferred and several alternate embodiments, it is to be appreciated that those skilled in the art will readily apply these teachings to other possible variations of the inventions.

The embodiment of the invention in which an exclusive property or privilege is claimed are defined as follows:

1. A method for fabricating a thermally stable low dielectric constant film comprising the steps of:
   providing a parallel plate plasma enhanced chemical vapor deposition (PECVD) chamber,
   positioning a substrate in said chamber,
   flowing a precursor gas containing Si, C, H, and optionally O into said PECVD chamber, said precursor gas further comprising organosilicon compounds having a ring structure, and
   depositing a non-polymeric hydrogenated silicon carbon or a non-polymeric hydrogenated oxidized silicon carbon film on said substrate, said film containing between about 5 and about 45 atomic percent carbon.

2. A method according to claim 1, wherein a plasma in said PECVD chamber is run in a continuous mode during said film deposition.

3. A method according to claim 1, wherein a plasma in said PECVD chamber is run in a pulsed mode during said film deposition.

4. A method according to claim 1 further comprising the step of selecting said organosilicon compound having a ring structure from the group consisting of 1,3,5,7-tetramethylcyclotetrasiloxane, tetraethylcyclotetrasiloxane, and decamethylcyclopentasiloxane.

5. A method according to claim 1, wherein said precursor gas is 1,3,5,7-tetra-methyl-cyclo-tetra-siloxane.

6. A method according to claim 1 further comprising the step of mixing said precursor with at least one member selected from the group consisting of hydrogen, oxygen, germanium, nitrogen and fluorine containing gases.

7. A method for fabricating a thermally stable hydrogenated oxidized silicon carbon low dielectric constant film according to claim 1 further comprising the step of heat treating said film at a temperature not higher than 300° C. for a first time period and heat treating said film at a temperature not lower than 300° C. for a second time period, said second time period being longer than said first time period.

8. A method for fabricating a thermally stable low dielectric constant film comprising the steps of:

provideing a plasma enhanced chemical vapor deposition (PECVD) chamber, positioning a substrate in said chamber, flowing a precursor gas containing Si, C, H and optionally O into said PECVD chamber, depositing a non-polymeric hydrogenated silicon carbon or a non-polymeric hydrogenated oxidized silicon carbon film on said substrate, and after depositing said film, heat treating said film at a temperature not higher than 300° C. for a first time period and heat treating said film at a temperature not lower than 300° C. for a second time period, said second time period being longer than said first time period.

9. A method according to claim 8, wherein said plasma enhanced chemical vapor deposition chamber is a parallel plate plasma reactor.

10. A method according to claim 8, wherein a plasma in said PECVD chamber is run in a continuous mode during said film deposition.

11. A method according to claim 8, wherein a plasma in said PECVD chamber is run in a pulsed mode during said film deposition.

12. A method according to claim 8, wherein said precursor gas containing Si, C, H and optionally O, further comprises organosilicon compounds having a ring structure.

13. A method according to claim 12, wherein said precursor gas is 1,3,5,7-tetra-methyl-cyclo-tetra-siloxane.

14. A method according to claim 8 wherein said precursor gas comprises from the group consisting of 1,3,5,7-tetramethylcyclotetrasiloxane, tetraethylcyclotetrasiloxane, and decamethylcyclopentasiloxane.

15. A method according to claim 8 further comprising the step of mixing said precursor with at least one member selected from the group consisting of hydrogen, oxygen, germanium, nitrogen and fluorine containing gases.

* * * * *